United States Patent [19]

Takahashi

[11] Patent Number: 4,947,030
[45] Date of Patent: Aug. 7, 1990

[54] ILLUMINATING OPTICAL DEVICE

[75] Inventor: Kazuhiro Takahashi, Kawasaki, Japan

[73] Assignee: Canon Kabushiki Kaisha, Tokyo, Japan

[21] Appl. No.: 326,439

[22] Filed: Mar. 22, 1989

Related U.S. Application Data

[63] Continuation of Ser. No. 253,894, Oct. 5, 1988, abandoned, which is a continuation of Ser. No. 865,453, May 21, 1986, abandoned.

[30] Foreign Application Priority Data

May 22, 1985 [JP] Japan ................................ 60-108438
Sep. 2, 1985 [JP] Japan ................................ 60-192094

[51] Int. Cl.$^5$ .......................... F21V 7/08; F21V 13/00; G02B 9/00
[52] U.S. Cl. ................................ 250/201.1; 250/205; 350/469; 362/268
[58] Field of Search .......................... 250/201, 204, 205; 350/167, 469; 355/67, 68, 71; 362/268

[56] References Cited

U.S. PATENT DOCUMENTS

| | | | |
|---|---|---|---|
| 3,988,066 | 10/1976 | Suzuki et al. | 350/167 |
| 4,027,944 | 6/1977 | Gottlieb | 362/268 |
| 4,117,375 | 9/1978 | Bachur et al. | 250/205 |
| 4,400,063 | 8/1983 | Hayashida | 350/6.91 |
| 4,436,383 | 3/1984 | Maeda | 350/469 |
| 4,460,260 | 7/1984 | Utagawa | 250/201 |
| 4,497,013 | 1/1985 | Ohta | 362/268 |
| 4,589,769 | 5/1986 | Matsuki | 355/71 |
| 4,598,197 | 7/1986 | Morita et al. | 355/68 |
| 4,645,924 | 2/1987 | Suzuki et al. | |
| 4,682,885 | 7/1987 | Torigoe | 355/67 |
| 4,683,524 | 7/1987 | Ohta | 362/268 |
| 4,717,242 | 1/1988 | Echizen et al. | 362/268 |

FOREIGN PATENT DOCUMENTS

| | | | |
|---|---|---|---|
| 2658289 | 7/1977 | Fed. Rep. of Germany | 350/469 |
| 59-160134 | 9/1984 | Japan | 350/167 |
| 1054817 | 11/1983 | U.S.S.R. | 350/469 |

Primary Examiner—Edward P. Westin
Attorney, Agent, or Firm—Fitzpatrick, Cells, Harper & Scinto

[57] ABSTRACT

An illuminating optical device including: a light source for emitting a light beam; and an illuminating optical system for receiving the light beam from the light source to irradiate an object with the light beam, the illuminating optical system having an optical axis and an illuminance-distribution changing lens system which is movable in the direction of the optical axis to change an illuminace-distribution forming characteristic of the illuminating optical system.

31 Claims, 15 Drawing Sheets

F I G. I

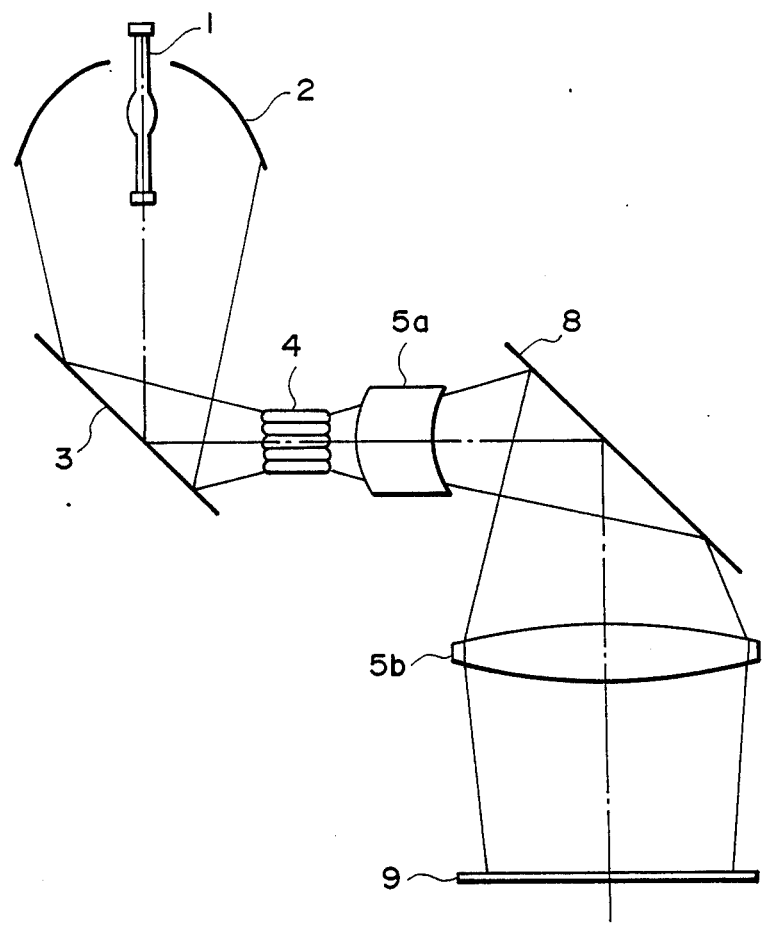
F I G. 4

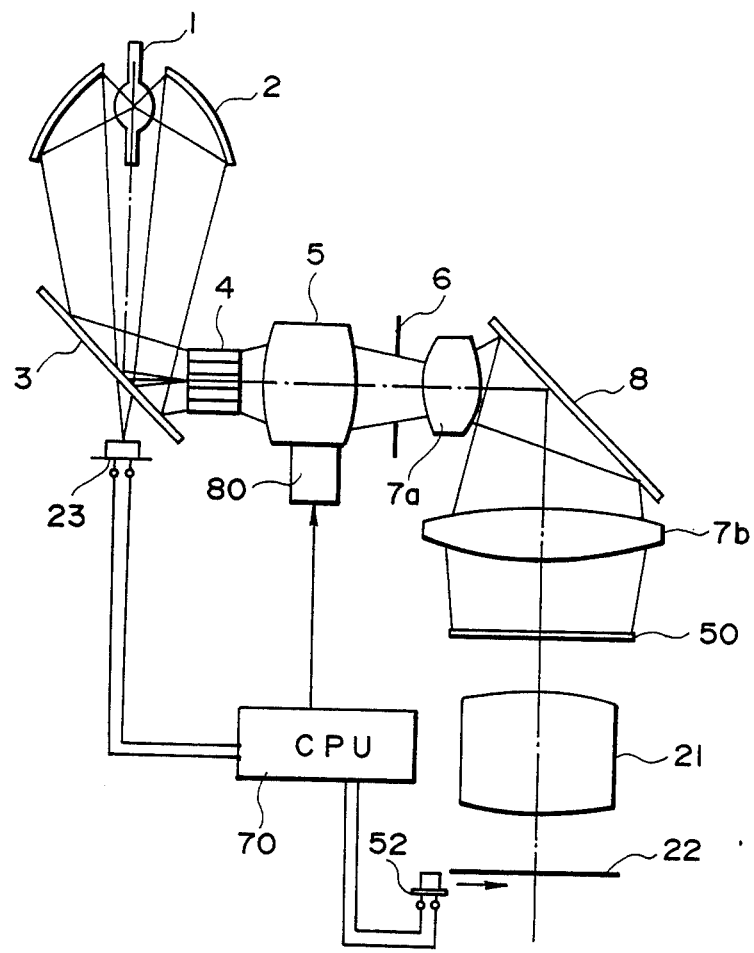
F I G. 8

ILLUMINATING OPTICAL DEVICE

This is a continuation of application Ser. No. 253,894 filed Oct. 5, 1988 which is a continuation of Ser. No. 865,453 filed May 21, 1986, both of which are now abandoned.

FIELD OF THE INVENTION AND RELATED ART

This invention relates generally to an illuminating optical device and, more particularly, to an illuminating optical device such as one to be used in a semiconductor device manufacturing exposure apparatus, in which strict uniformity is required in respect to distribution of illuminance.

In some type of semiconductor device manufacturing exposure apparatuses, an optical integrator is used to provide uniform distribution of illuminance on the surface of a semiconductor wafer. Also, lens systems of an illumination optical system of the exposure apparatus are so designed as to effectively produce uniform distribution of illuminance. This is because, to enhance reproducibility of line width of a circuit pattern which is very fine, unevenness in the illuminance should be suppressed.

However, even if the optical system is designed to provide uniform distribution of illuminance, there is a possibility of occurrence of uneven illuminance due to errors in the manufacture and assembling of the illuminating optical device. Such uneven illuminance must be eliminated. For this reason, adjustment is required. Further, in some cases, it is desired to form a particular distribution of illuminance, which is not uniform.

Conventionally, optical filter means having different transmission factors is introduced into the illuminating optical system in an attempt to obtain desired illuminance distribution. This involves a problem of reduction in absolute illuminance on the surface being illuminated. Also, the illuminance distribution can not be changed infinitely or continuously.

SUMMARY OF THE INVENTION

It is accordingly a primary object of the present invention to provide an illuminating optical device by which the illuminance distribution can be changed infinitely or continuously, without decreasing the illuminance.

To achieve this, according to one aspect of the present invention, there is provided an illuminating optical device including an illuminance-distribution changing lens system which is arranged to be movable in the direction of an optical axis of the illuminating optical device so as to change illuminance-distribution forming characteristics of the device. Particularly in accordance with one preferred form of the present invention, the illuminance-distribution changing lens system includes a first pair of condenser lens elements with a spacing defined therebetween and a second pair of condenser lens elements similarly having a spacing defined therebetween. The spacing between the condenser lens elements of the second pair is adjustable thereby to obtain desired illuminance-distribution forming characteristics. Also, the spacing between the condenser lens elements of the first pair is adjustable so as to correct or compensate for any change in optical characteristics, other than the illuminance-distribution forming characteristics, which might be caused by the adjustment of the spacing between the condenser lens elements of the second pair.

An illumination optical system into which the illuminating optical device of the present invention is incorporated is, therefore, capable of minimizing unevenness in the illuminance or, if desired, producing uneven illuminance to thereby provide a particular illuminance distribution which is not uniform.

In accordance with another aspect of the present invention, the illuminating optical device further includes photodetector means for detecting or measuring illuminance distribution on the surface to be illuminated, and driving means for moving or displacing the illuminance-distribution changing lens system in accordance with output signals from the photodetector means, thereby to adjust the position of the illuminance-distribution changing lens system. With this arrangement, the illuminance distribution on the surface to be illuminated is measured automatically and, after calculating the amount of lens displacement necessary for obtaining desired illuminance distribution, the illuminance-distribution changing lens system is moved by the driving means in accordance with the result of calculation. By this, desired illuminance distribution is attainable automatically.

These and other objects, features and advantages of the present invention will become more apparent upon a consideration of the following description of the preferred embodiments of the present invention taken in conjunction with the accompanying drawings.

DESCRIPTION OF THE DRAWINGS

FIG. 4 is a schematic view of an illuminating optical device according to another embodiment of the present invention, which is incorporated into a semiconductor device manufacturing exposure apparatus.

FIG. 8 is a schematic and diagrammatic view of an illuminating optical device according to a still further embodiment of the present invention, which is incorporated into a semiconductor device manufacturing exposure apparatus and which has a function of automatically detecting illuminance distribution on the surface of a semiconductor wafer.

DESCRIPTION OF THE PREFERRED EMBODIMENTS

Figure 1:
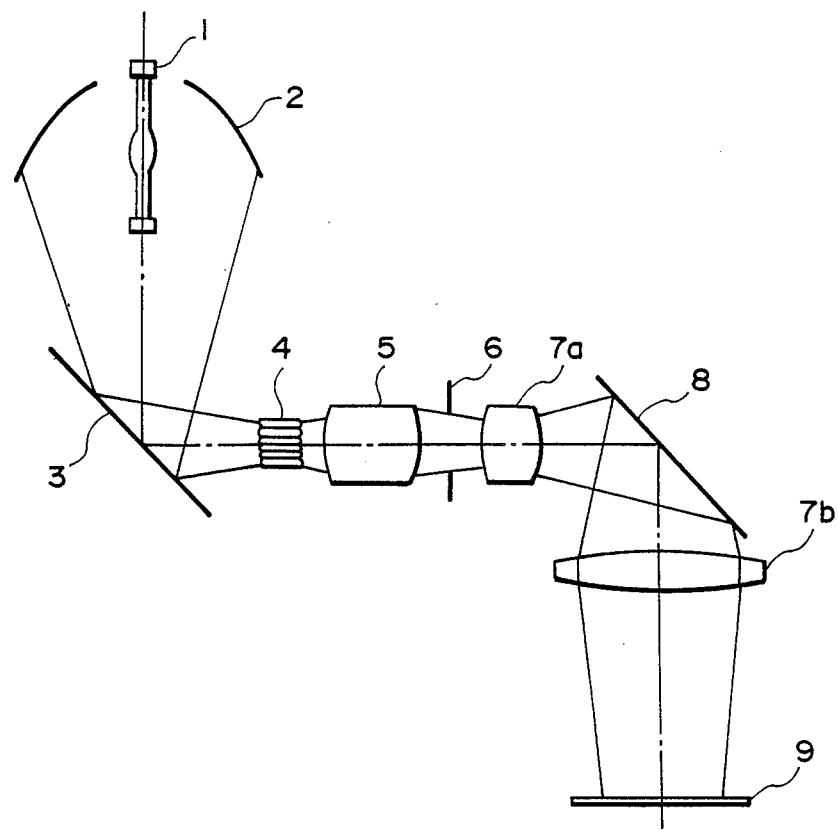
FIG. 1 is a schematic view of an illuminating optical device according to one embodiment of the present invention, which is incorporated into a semiconductor device manufacturing exposure apparatus.

Referring first to FIG. 1, there is shown an illuminating optical device according to one embodiment of the present invention, which is incorporated into a semiconductor device manufacturing exposure apparatus. Denoted in FIG. 1 by numeral 1 is a light source comprising a Hg lamp; by 2, an elliptical mirror; by 3, a mirror; and by 4, an optical integrator adapted to define plural secondary light sources. Light emitted from the Hg lamp 1 is concentrated on the optical integrator 4 which is placed at the position of a second focal point of the elliptical mirror 2. Denoted by numeral 5 is an illuminance-distribution changing condenser lens system; and by 6, a masking member for defining a light-transmitting window. The optical integrator 4 defining secondary light sources is adapted to illuminate the masking means 6 with the aid of the illuminance-distribution changing condenser lens system 5. Denoted by numerals 7a and 7b are imaging lenses, respectively; by 8, a mirror; and by 9, a photomask. The masking means 6 is adapted to determine the range or field of illumination to be defined on the surface of the photomask 9. By means of the imaging lenses 7a and 7b, an image of the masking means 6 is formed on the surface of the photomask 9. In order to change the illuminance distribution on the surface of the photomask 9, the illuminance-distribution changing condenser lens system 5 is made movable, according to the present invention, in the direction of an optical axis of the illuminating optical device, by which the illuminance distribution on the surface of the masking means 6 is changed. And, such change in the illuminance distribution at the masking means 6 is reproduced on the surface of the photomask 9 by means of the imaging lenses 7a and 7b.

Figure 2:
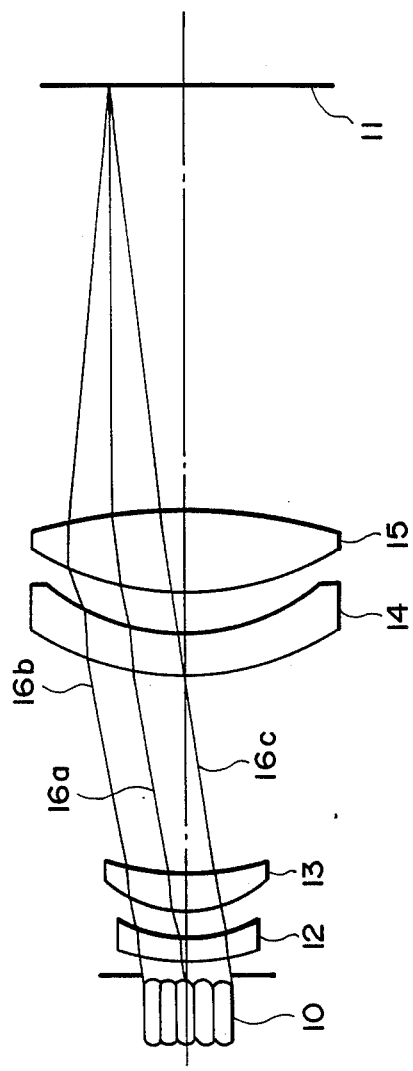
FIG. 2 is a schematic view for explicating the principle of control of illuminance distribution by an illuminance-distribution changing condenser lens system according to the present invention.

FIG. 2 is a view for explicating the principle of control of illuminance distribution, and shows a typical example of the structure of the illuminance-distribution changing condenser lens system 5 of FIG. 1. Denoted in FIG. 2 by numeral 10 is light source means (secondary light source means) which corresponds to the optical integrator 4 of FIG. 1. As shown in FIG. 2, the distribution changing optical system includes two pairs of condenser lenses 12 – 15, by which a surface 11, to be illuminated, is irradiated with the light emerging from the light source 10. For the control of illuminance distribution, the spacing between the condenser lenses 14 and 15 is adjustable such that the illuminance distribution on the surface 11 is changed. Also, the spacing between the condenser lenses 12 and 13 is adjustable so as to correct or compensate for any change in focal length and/or aberration of the optical system caused by the changing of the illuminance distribution. Thus, by the adjustment of the spacing between the condenser lenses 12 and 13, the optical characteristics, other than the illuminance distribution, can be maintained substantially unchanged irrespective of the change in the illuminance distribution.

Of the distribution changing optical system, the condenser lens 12 is provided by a negative meniscus lens having a convex surface facing the light source 10 side, the condenser lens 13 is provided by a positive meniscus lens having a convex surface facing the light source 10 side, the condenser lens 14 is provided by a positive meniscus lens having a convex surface facing the light source 10 side, and the condenser lens 15 is provided by a biconvex lens. The condenser lenses 12 and 13 cooperate to define therebetween an aerial lens of meniscus shape, while the condenser lenses 14 and 15 cooperate to define therebetween an aerial lens of meniscus shape.

Important factors in an illumination optical system to be used in the semiconductor device manufacturing exposure apparatus are the effective illumination range, illuminance distribution, numerical aperture of the illumination system, and effective distribution of images of light source. When the illuminance distribution is changed by the displacement of the lens system in accordance with the present invention, the illumination range, numerical aperture and effective distribution of images of light source are changed with the change in the illuminance distribution. In order to prevent this, i.e., to maintain constant illumination range, numerical aperture and effective distribution of images of light source, at least two lens components are displaced such that, at the time of adjustment of the illuminance distribution, changes in the other optical characteristics are corrected or compensated for whereby these optical characteristics are maintained substantially constant regardless of the change in the illuminance distribution. For this purpose, two pairs of lenses (12, 13; 14, 15) are used such as shown in FIG. 2. Details of this will be described below.

It is now assumed that the co-ordinate, in the plane of the surface 11 to be illuminated, of the light beam emitted from the light source 10 with an angle $\theta$ is $y\theta$, and that the co-ordinate, in the plane of the surface 11, of the light beam emitted from the light source 10 with an angle "$\theta + \Delta\theta$" is "$y\theta + \Delta y$". To change the illuminance distribution on the surface 11 being illuminated corresponds to changing $(y\theta + \Delta y - y\theta)/\Delta\theta$.

The spacing (air) between the lenses 14 and 15 is provided to allow changing the distribution of $(y\theta + \Delta y - y\theta)/\Delta\theta$.

Although, it is necessary to displace the lens 14 and/or the lens 15 in order to change the illuminance distribution on the surface 11, to be illuminated, any change in the illumination range and/or numerical aperture resulting from the displacement of the lens component should be suppressed. That is, variation in the spacing (aerial distance) between the lenses 14 and 15 causes changes in paraxial parameters and/or aberration of the optical system, which result in changes in the illumination range, numerical aperture and/or effective distribution of images of light source. To prevent or suppress occurrence of changes in such optical characteristics, the condenser lenses 12 and 13 having adjustable spacing are provided.

More specifically, by adjusting the spacing between the lenses 12 and 13, the focal length of the optical system which otherwise would be changed with the displacement of the lens 14 and/or the lens 15 can be maintained substantially constant and, in addition thereto, unpreferable shift of a ray (upper ray) 16b from the rays 16a and 16c, on the plane of the surface 11, due to the change in the spacing between the lenses 14 and 15 can be substantially prevented. Thus, the adjustment of lens position at two points in the optical system allows adjustment of the illuminance distribution without occurrence of deformation of the image of light source, shading of rays, etc. That is, this assures control of illuminance distribution while maintaining the illumination range and numerical aperture substantially unchanged.

Figure 3A:
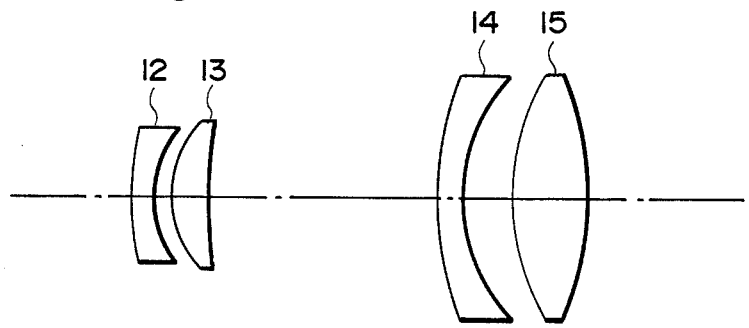
FIGS. 3A and 3B are schematic views, respectively, showing adjustment of lens position for changing distribution of illuminance.
Figure 3B:
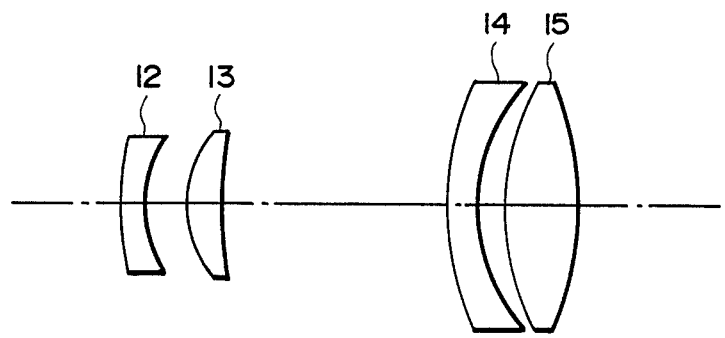
Figure 3C:
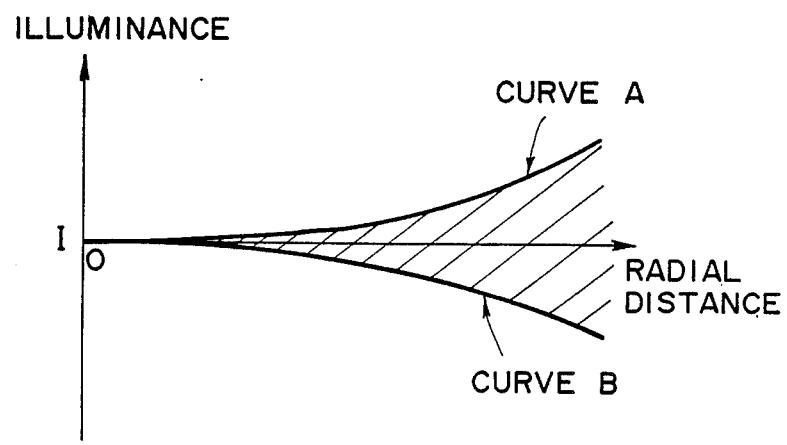
FIG. 3C is a graph showing changes in the illuminance distribution.

FIGS. 3A - 3C show lens displacement and resulting changes in the illuminance distribution. In the graph of FIG. 3C, the axis of abscissa denotes radial distance, on the surface to be illuminated, from a point thereof intersecting with the optical axis, and the axis of ordinate denotes illuminance on the surface being illuminated. In the graph of FIG. 3C, the illuminance is depicted in the form of ratio, taking the illuminance at the point intersecting with the optical axis as being the reference. The illuminance distribution provided by the distribution changing lens system comprising the condenser lenses 12 - 15 when it is in the FIG. 3A position which is one end of the movable range is depicted by a curve A in FIG. 3C, while the illuminance distribution provided by the distribution changing lens system when it is in the FIG. 3B position which is the other end of the movable range is depicted by a curve B in FIG. 3C. By this adjustment of the lens position within the range between the FIG. 3A position and the FIG. 3B position, the illuminance distribution is changed continuously. The hatched area in the graph of FIG. 3C shows such adjustable range of the illuminance distribution.

FIG. 4 is a schematic view of another embodiment of the illuminating optical device of the present invention, which is incorporated into a semiconductor device manufacturing exposure apparatus. In FIG. 4, elements having similar or corresponding functions as of those of FIG. 1 embodiment are denoted by the same reference numerals. Denoted in FIG. 4 by numerals 5a and 5b are condenser lenses which constitute an illuminance-distribution changing lens system.

In the embodiment of FIG. 1, the position of the distribution changing condenser lens system 5 is adjusted to change the illuminance distribution on the plane of the masking member 6, and such change in the illuminance distribution is reproduced on the surface of the mask 9. In the embodiment of FIG. 4, as compared therewith, adjustment of the illuminance-distribution changing lens system comprising the condenser lenses 5a and 5b directly changes the illuminance distribution on the surface of the mask 9.

In the foregoing embodiments, the illuminance-distribution changing lens system receives light emitted from an optical integrator which is a "plane" light source, not a point light source. However, the illuminating optical device of the present invention is not limited to use with such "plane" light source, and it is usable with a point light source. For the light from a point light source disposed on the optical axis, the illuminance distribution can be changed by changing the spacing between the condenser lenses 14 and 15, as in the foregoing embodiments. In the case of using a point light source, the change in the spacing between the condenser lenses 14 and 15 causes substantially no change in the other optical characteristics such as the focal length, transverse aberration, etc., since the point light source is located on the optical axis. For this reason, use of the condenser lenses 12 and 13 provided in the foregoing embodiments for the sake of compensation for the change in the other optical characteristics is not necessary. So, the structure can be made simple and thus the design thereof is easy.

In general, the arrangement of the illuminance-distribution changing lens system shown in FIG. 1 is preferable to that shown in FIG. 4. This is because, in ordinary illumination systems usable in the semiconductor device manufacturing exposure apparatuses, the diameter of the light beam directed to the surface to be illuminated increases with the advancement of the light. So, in the arrangement of FIG. 4, larger diameter lenses have to be used in the illuminance-distribution changing lens system. This leads to an increase in the manufacturing cost and an increase in the load for the driving of the lens components. In this respect, to control the illuminance distribution at a point near to the light source, such as in the FIG. 1 embodiment, is preferable.

Figure 5:
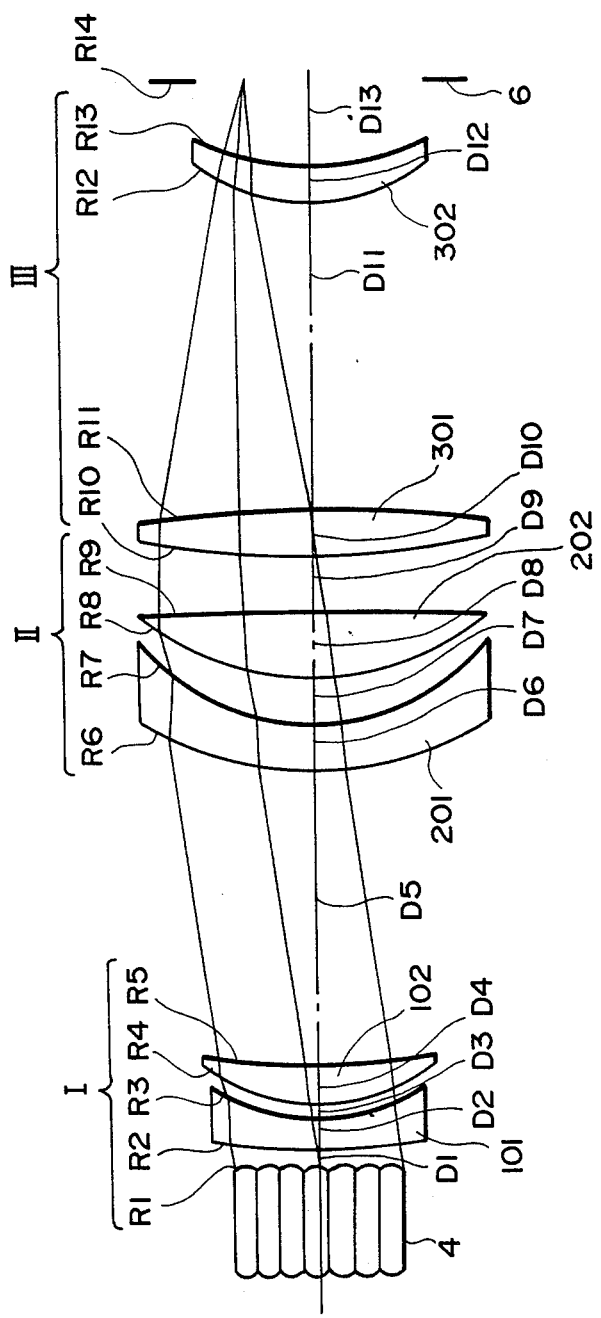
FIG. 5 is a schematic view showing an example of a more concrete form of an illuminating optical device according to an embodiment of the present invention.

FIG. 5 is a sectional view showing an illuminance-distribution changing lens system designed in accordance with the present invention. This distribution changing lens system is usable as the condenser lens system shown in FIG. 1.

As shown in FIG. 5, the distribution changing lens system of the present embodiment comprises six lens components arranged in three groups I, II and III. The lens system includes, in an order from the optical integrator 4 side to the masking member 6 side, a first lens group I comprising a negative meniscus lens 101 having a convex surface facing the light source 4 and a positive meniscus lens 102 having a convex surface facing the light source 4; a second lens group II comprising a positive meniscus lens 201 having a convex surface facing the light source 4 side and a biconvex lens 202; and a third group III comprising a biconvex lens 301 and a positive miniscus lens 302 having a convex surface facing the light source 4 side.

In this embodiment, the positive meniscus lens 201 of the second lens group II is movable along the optical axis to change the illuminance distribution on the surface of the masking member 6. Also, the positive meniscus lens 102 of the first lens group I is movable in the direction of the optical axis to correct the change in the aberration and/or the focal length resulting from the displacement of the meniscus lens 201 of the second lens group 2. The third lens group III is provided in order to correct the aberration of the distribution changing lens system as a whole.

At the time of changing the illuminance distribution, the positive meniscus lens 102 of the first lens group I and the positive meniscus lens 202 of the second lens group II are moved in the same direction at the ratio of 1:2. In the case of FIG. 3A wherein the quantity of light at the peripheral portion is to be increased, these meniscus lenses 102 and 202 are moved by distances −1.5 mm and −3.0 mm (leftwardly as viewed in FIG. 5), respectively. On the other hand, in the case of FIG. 3B wherein the quantity of light at the peripheral portion is to be decreased, the meniscus lenses 102 and 202 are moved by distances +2.0 mm and +4.0 mm (rightwardly as viewed in FIG. 5), respectively.

The first lens group I of the present embodiment is preferably disposed in the vicinity of the optical integrator 4. If the first lens group I is disposed away from the optical integrator 4 which is a "plane" light source, a large amount of lens displacement is necessary to correct or compensate for the changes in the optical characteristics (other than the illuminance distribution forming characteristics adjusted by the second lens group II) such as the transverse aberration, focal length, etc. Also, in some cases, it is possible that the adjustment of the illuminance distribution by means of the second lens group II is cancelled.

Shown below are numerical data of the illuminating optical device of the FIG. 5 embodiment. In the following data R1, R2, ... R14 are curvature radii of the surface such as depicted by these characters in FIG. 5; D1, D2, ... D13 are thickness or air spacing defined between the surfaces Rn and Rn+1 and measuring on the optical axis; $\nu$ and N are Abbe's number and refraction factor defined for the g-line.

TABLE 1

| (No.) | R | D |
|---|---|---|
| 1 | 0.0 | 3.08623 |
| 2 | 132.80148 | 7.00000 |
| 3 | 41.14901 | 3.23418 |
| 4 | 43.62046 | 8.00000 |
| 5 | 133.77199 | 63.62386 |
| 6 | 74.45142 | 10.00000 |
| 7 | 50.81302 | 9.43281 |
| 8 | 60.10762 | 14.00000 |
| 9 | −2036.58745 | 12.45397 |
| 10 | 207.22881 | 10.00000 |
| 11 | −309.07502 | 67.05710 |
| 12 | 43.64093 | 8.00000 |
| 13 | 64.58879 | 18.03668 |
| 14 | 0.0 | |

TABLE 2

| | N | $\nu$ |
|---|---|---|
| D1 | 1. | |
| D2 | 1.526210 | 64.10 |
| D3 | 1. | |
| D4 | 1.526210 | 64.10 |
| D5 | 1. | |
| D6 | 1.526210 | 64.10 |
| D7 | 1. | |
| D8 | 1.526210 | 64.10 |
| D9 | 1. | |
| D10 | 1.526210 | 64.10 |
| D11 | 1. | |
| D12 | 1.526210 | 64.10 |
| D13 | 1. | |

Each of the lens components was made of an optical glass BK 7. The air spacings D3, D5 and D7 are variable. The numerical data "D" on the thickness or air-spacing are those defined when the illuminance-distribution changing lens system is in its reference state.

Figure 10A:
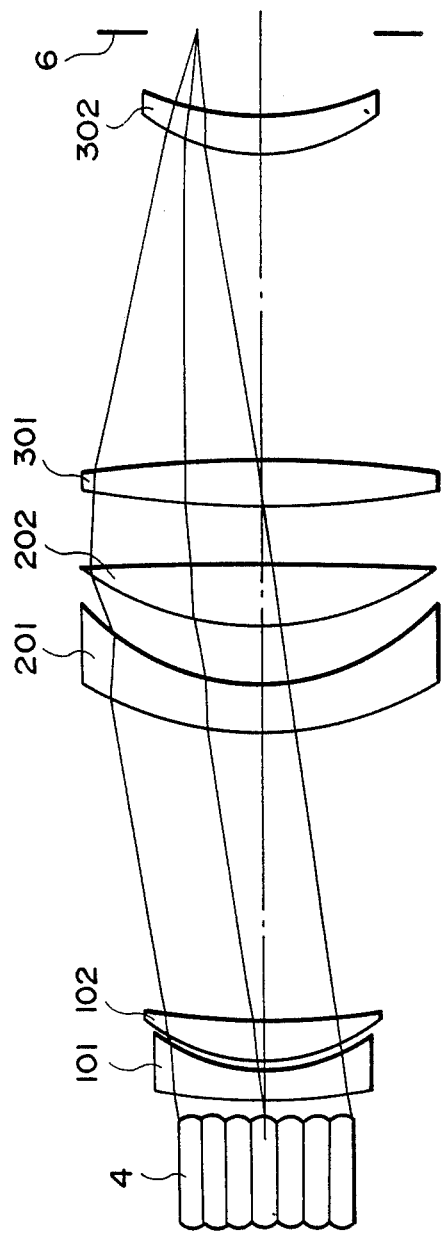
FIGS. 10A – 10C are sectional views, respectively, showing the manner of control of illuminance distribution by an illuminance-distribution changing optical device of the present invention when it is incorporated into a particular illumination optical system.
Figure 10B:
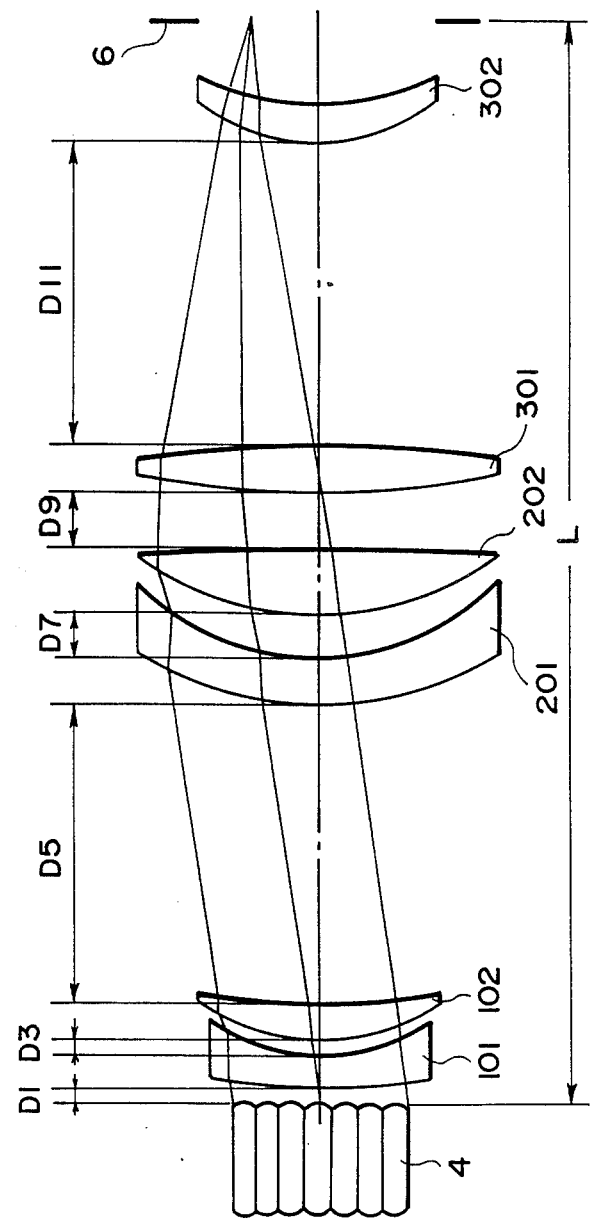
Figure 10C:
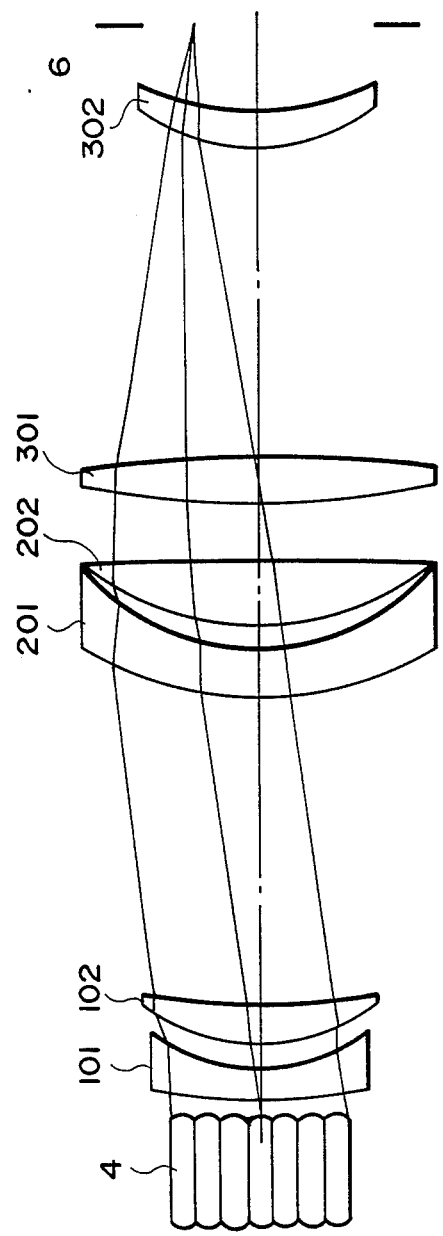

The illuminance-distribution changing optical device of the FIG. 5 embodiment, when it is incorporated into a particular illumination optical system is illustrated in FIGS. 10A - 10C. Of these drawings, FIG. 10B shows the distribution changing optical device when it is in the reference state. Table 3 below shows other numerical data of the FIG. 5 device as it is incorporated into the particular illumination optical system, such as shown in FIGS. 10A - 10C.

TABLE 3

| L | 233.9 |
|---|---|
| f | 97.28 |

TABLE 3-continued

| l1 | 140.35 |
|---|---|
| l2 | 97.16 |
| l3 | −37.58 |
| l4 | 0.12 |

In the Table 3, L is the total length of the device defined between the light emitting surface of the optical integrator 4 and the surface of the masking member 6; f is the focal length of the distribution changing lens system, as a whole, comprising six lens components arranged in three lens groups; l1 is the distance from the optical integrator 4 to the front principal point of the distribution changing lens system; l2 is the distance from the rear principal point of the distribution changing lens system to the surface of the masking member 6; l3 is the distance between the principal points: and l4 is the back focus. of the FIGS. 10A - 10C, FIG. 10B shows, as described, the reference state of the distribution changing lens system which is in the same position as in the FIG. 5 case. FIG. 10A shows the state of distribution changing lens system wherein the spacings D3, D5 and D7 are changed so as to increase the illuminance in such region of the surface to be illuminated that is spaced away from the center of the surface to be illuminated (the point intersecting with the optical axis). Hereinafter, such region will be referred to as "peripheral region". FIG. 10C shows the state of the distribution changing lens system wherein the spacings D3, D5 and D7 are changed so as to decrease the illuminance in the peripheral region. As it will be seen from FIGS. 10A - 10C, the illuminance distribution on the surface to be illuminated is changed by moving the meniscus lenses 102 and 202 of the first and second lens groups I and II, in the manner as has been described with reference to FIGS. 2 and 3. The values of spacings D3, D5 and D7 for the three cases of FIGS. 10A - 10C are shown in Table 4.

TABLE 4

| | FIG. 10A | FIG. 10B | FIG. 10C |
|---|---|---|---|
| D3 | 1.83 (mm) | 3.23 | 5.23 |
| D5 | 62.12 | 63.62 | 65.62 |
| D7 | 12.43 | 9.43 | 5.43 |

Figure 11A:
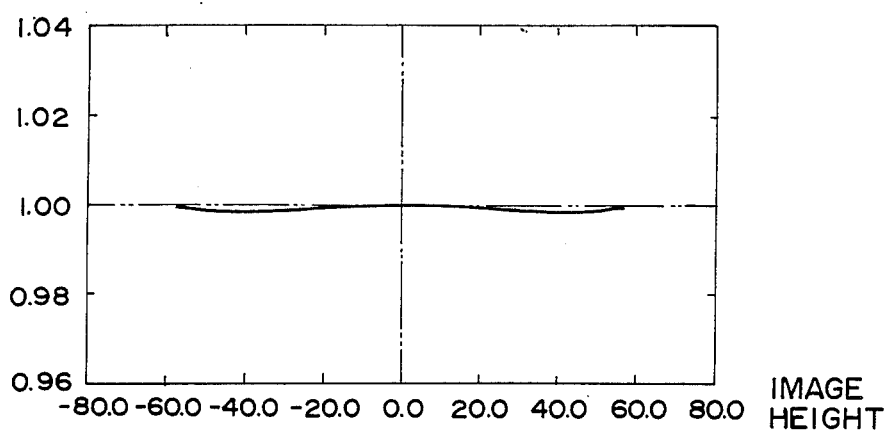
FIGS. 11A – 11C are graphs, respectively, showing illuminance distributions produced by the illuminance-distribution changing optical system in the states of FIGS. 10A – 10C, respectively.
Figure 11B:
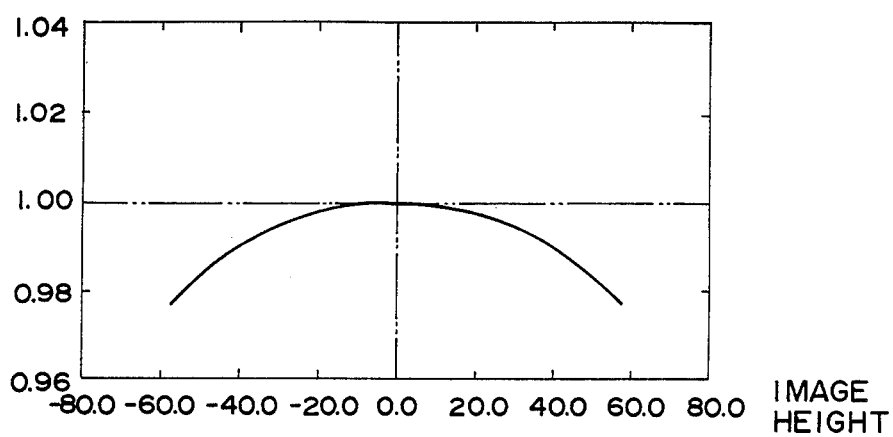
Figure 11C:
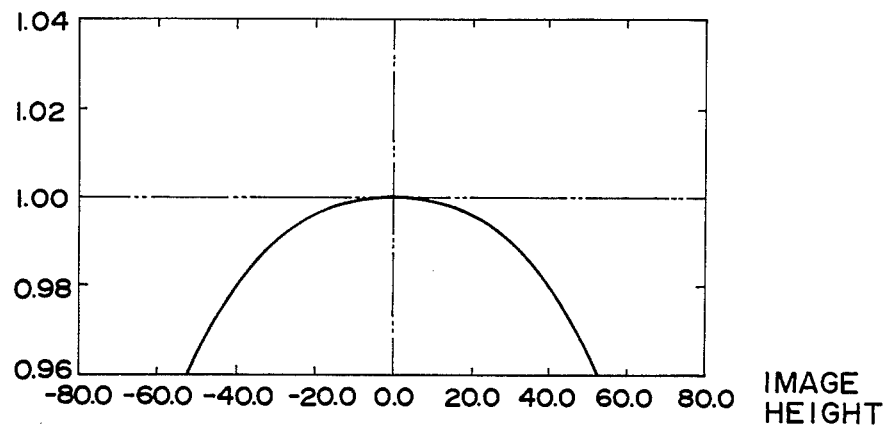

FIGS. 11A - 11C show illuminance distributions produced on the surface illuminated, in accordance with the three states of FIGS. 10A - 10C, respectively. In each of FIGS. 11A - 11C, the axis of abscissa denotes the distance (mm) from the position of center of the surface to be illuminated, and the axis of ordinate denotes the ratio of illuminance with reference to the illuminance defined at the center of the surface illuminated.

Tables 5 - 7 given below show numerical data obtained by calculation concerning the illuminance at various points on the surface to be illuminated, wherein Table 5 corresponds to the state of FIG. 10A and thus to the graph of FIG. 11A; Table 6 corresponds to the state of FIG. 10B and thus to the graph of FIG. 11B; and Table 7 corresponds to the state of FIG. 10C and thus to the graph of FIG. 11C. In each of Tables 5 - 7, "DIST" is the distance from the center of the surface to be illuminated, intersecting with the optical axis, and "ILLUM" is the ratio of illuminance at the corresponding distance relative to the illuminance at the center of the surface to be illuminated.

TABLE 5

(FIG. 10A state)

| DIST | ILLUM |
|---|---|
| 57.60599 | 0.99951 |
| 51.84872 | 0.99863 |
| 46.08649 | 0.99838 |
| 40.32256 | 0.99849 |
| 34.55875 | 0.99877 |
| 28.79596 | 0.99911 |
| 23.03455 | 0.99943 |
| 17.27451 | 0.99971 |
| 11.51565 | 0.99990 |
| 5.75761 | 1.00000 |
| 0.0 | 1.00000 |
| −5.75761 | 1.00000 |
| −11.51565 | 0.99990 |
| −17.27451 | 0.99971 |
| −23.03455 | 0.99943 |
| −28.79596 | 0.99911 |
| −34.55875 | 0.99877 |
| −40.32256 | 0.99849 |
| −46.08649 | 0.99838 |
| −51.84872 | 0.99863 |
| −57.60599 | 0.99951 |

TABLE 6

(FIG. 10B state)

| DIST. | ILLUM |
|---|---|
| 57.82086 | 0.97688 |
| 51.97050 | 0.98214 |
| 46.14439 | 0.98654 |
| 40.33827 | 0.99018 |
| 34.54848 | 0.99315 |
| 28.77190 | 0.99552 |
| 23.00574 | 0.99736 |
| 17.24760 | 0.99870 |
| 11.49527 | 0.99957 |
| 5.74670 | 1.00000 |
| 0.0 | 1.00000 |
| −5.74670 | 1.00000 |
| −11.49527 | 0.99957 |
| −17.24760 | 0.99870 |
| −23.00574 | 0.99736 |
| −28.77190 | 0.99552 |
| −34.54848 | 0.99315 |
| −40.33827 | 0.99018 |
| −46.14439 | 0.98654 |
| −51.97050 | 0.98214 |
| −57.82086 | 0.97688 |

TABLE 7

(FIG. 10C state)

| DIST | ILLUM |
|---|---|
| 57.99934 | 0.94904 |
| 52.03993 | 0.96161 |
| 46.14195 | 0.97165 |
| 40.29155 | 0.97965 |
| 34.47816 | 0.98600 |
| 28.69348 | 0.99094 |
| 22.93082 | 0.99470 |
| 17.18463 | 0.99740 |
| 11.45017 | 0.99914 |
| 5.72324 | 1.00000 |
| 0.0 | 1.00000 |
| −5.72324 | 1.00000 |
| −11.45017 | 0.99914 |
| −17.18463 | 0.99740 |
| −22.93082 | 0.99470 |
| −28.69348 | 0.99094 |
| −34.47816 | 0.98600 |
| −40.29155 | 0.97965 |
| −46.14195 | 0.97165 |
| −52.03993 | 0.96161 |
| −57.99934 | 0.94904 |

Figure 12A:
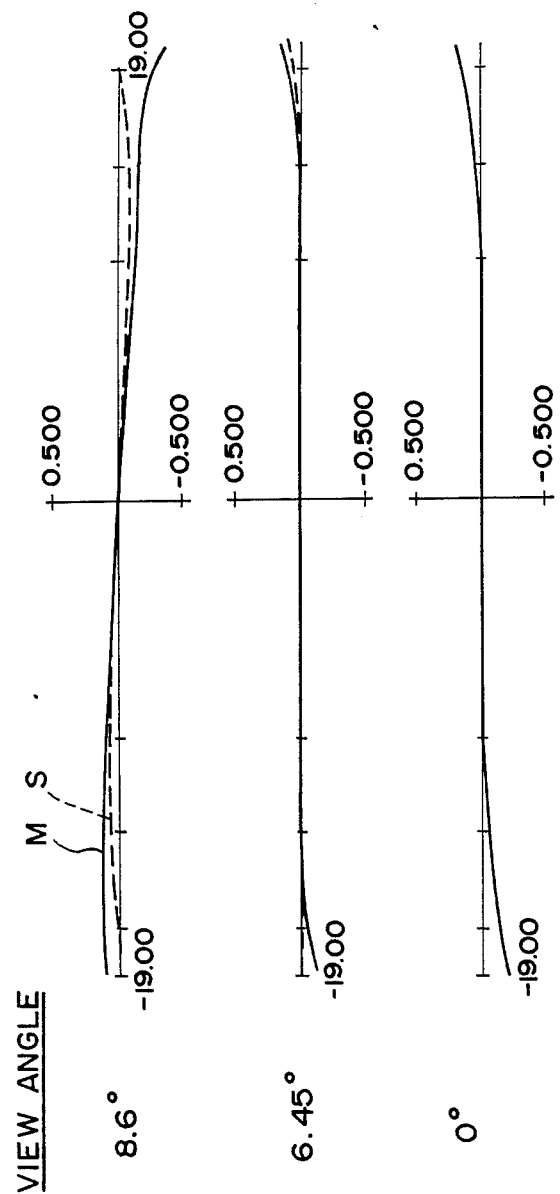
FIGS. 12A – 12C show transverse aberrations of the illuminance-distribution changing optical device in the states of FIGS. 10A – 10C, respectively.
Figure 12B:
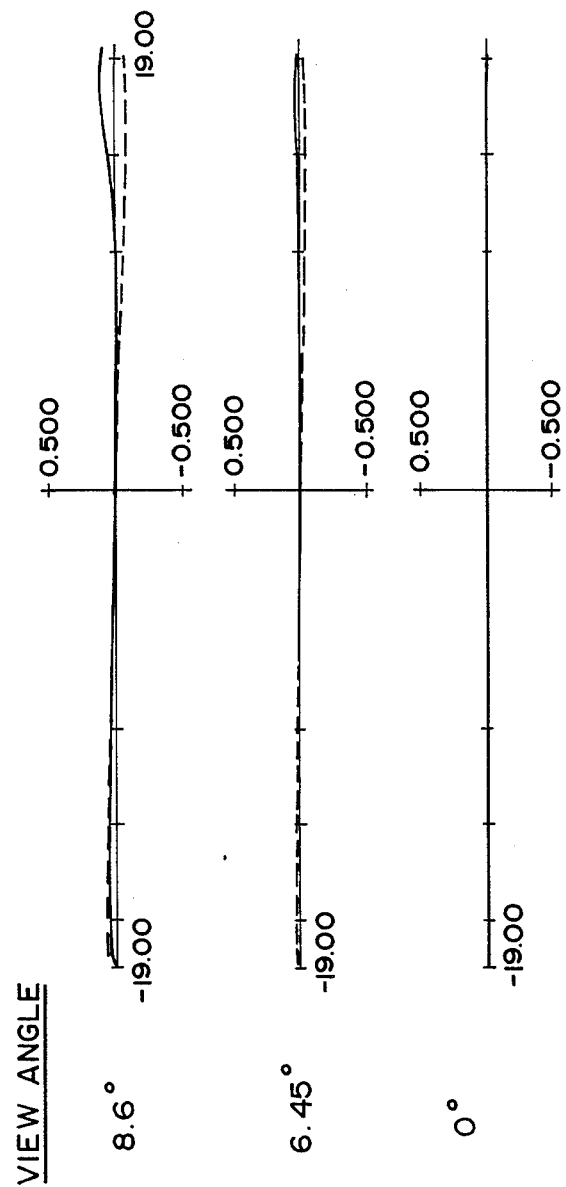
Figure 12C:
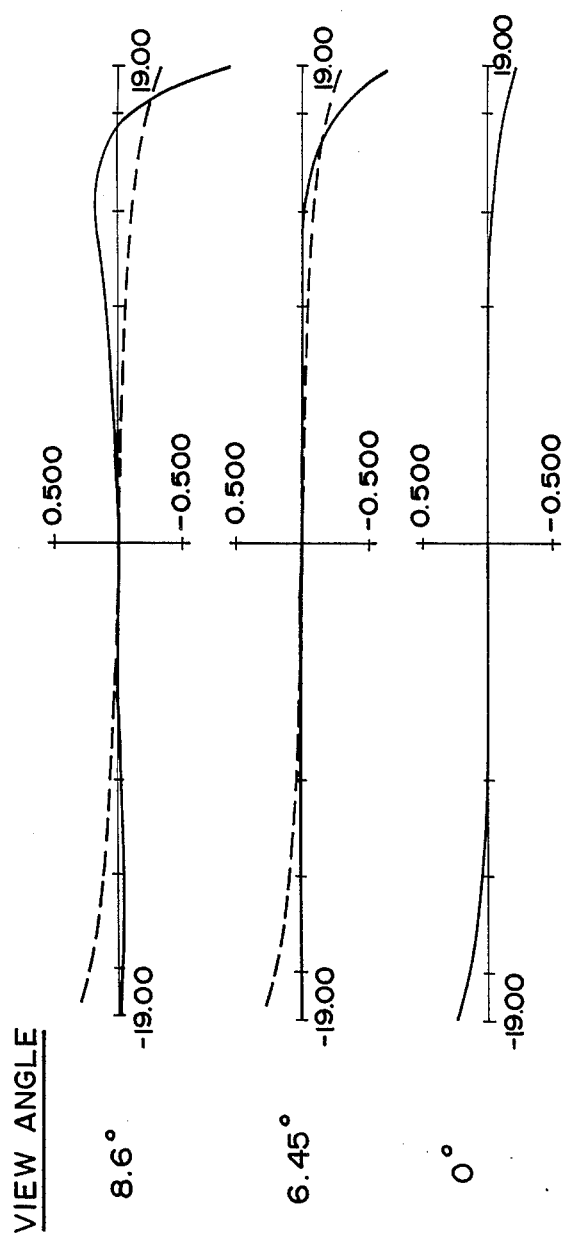

FIGS. 12A – 12C show transverse aberrations of the illuminance-distribution changing lens system when it is in the states of FIGS. 10A – 10C, respectively. More particularly, FIG. 12A show transverse aberrations defined, for different view angles, by the distribution changing lens system in the state of FIG. 10A. Similarly, FIG. 12B corresponds to FIG. 10B, and FIG. 12C corresponds to FIG. 10C. In each of FIGS. 12A – 12C, the axis of abscissa denotes the height (mm) in the light-emitting surface of the optical integrator, while the axis of ordinate denotes the amount of transverse aberration ($\mu$m), i.e. the amount of shift of the position of incidence, on the surface being illuminated, of rays from the position of incidence on the same surface of the principal ray. In FIGS. 12A – 12C, M denotes the meridional direction while S denotes the sagittal direction.

In the illuminating optical device of the type described above, the transverse aberration, of various aberrations, chiefly has influence on illumination performance. In accordance with the present invention, as will be seen from FIGS. 12A – 12C, the transverse aberration can be suppressed satisfactorily irrespective of that the state of the illuminance-distribution changing optical system is changed such as shown in FIGS. 10A – 10C so as to change the illuminance distribution on the surface being illuminated as shown in FIGS. 11A – 11C.

In accordance with the present invention, as will be understood from the foregoing, the illuminance distribution on the surface to be illuminated can be changed continuously, while satisfactorily suppressing changes in the illumination range, decrease of illuminance, deformation of the image of the light source to be formed on the surface, to be illuminated, which affects the imaging performance, and so on.

Further, where the illuminating optical device of the present invention is incorporated into a semiconductor device manufacturing exposure apparatus, unevenness in the illuminance can be minimized by the adjustment which is allowed by the illuminance-distribution changing lens system of the present invention. Also, if desired, unevenness in the illuminance can be positively or intentionally produced so as to attain a desired illuminance distribution which is not uniform.

As described in the foregoing, one of the important features of the present invention lies in the inclusion of the illuminance-distribution changing lens system which is displaceable in the direction of the optical axis. As to such illuminance-distribution changing lens system, the paired-lens arrangement having a spacing defined between lens components, as in the foregoing embodiments, is preferable. By changing such air spacing between the lens components, the illuminance distribution on the surface to be illuminated is changed. To change the air spacing is equivalent to changing the thickness of an aerial lens defined by the opposed surfaces of the pair of lens components. Also, correction or compensation for the changes in the other optical characteristics caused by the adjustment of the illuminance distribution can be considered as the effect of changing the thickness of an aerial lens defined by opposed surfaces of another pair of lens components.

Particularly in the embodiment of FIG. 5, the opposed surfaces R7 and R8 of the pair of lens components 201 and 202 have substantially the same radius of curvature in order to prevent substantial change in the other optical characteristics, more particularly the power (focal length) of the optical system. From the same reason, it is preferable that, as in the FIG. 5 embodiment, the surface (R3) of the first lens component (101)

of the first lens group (I), facing the image field side, and the surface (R6) of the first lens component (201) of the second lens group (II), facing the light source side, have substantially the same radius of curvature. Also it is preferable, for the same reason, that the surface (R2) of the first lens component (101), which surface is nearest to the light source side and the surface (R5) of the second lens component (102), which surface is nearest to the image field side, of the same first lens group (I) have substantially the same radius of curvature.

In another aspect, consideration should be made also to the radius of curvature of the aerial lens described above. If it is too large, the optical characteristics other than the illuminance-distribution forming characteristics will change excessively, so that correction thereof will be difficult to achieve. If, on the other hand, the radius of curvature is too small, the amount of change in the thickness of the aerial lens at the time of changing the illuminance distribution becomes so large that makes the designing of the lens system difficult.

Figure 6:
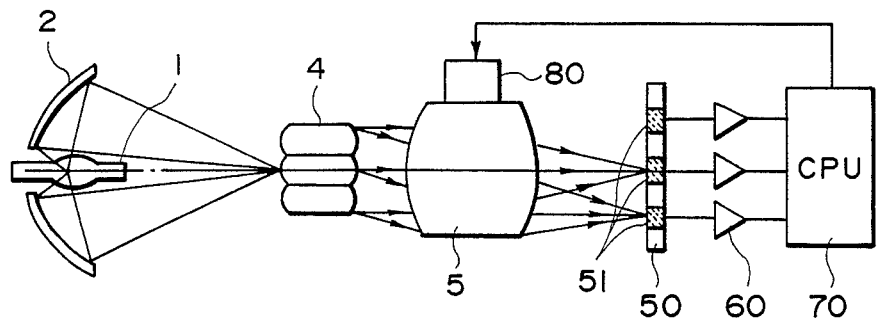
FIG. 6 is a schematic and diagrammatic view of an illuminating optical device according to a further embodiment of the present invention, which is incorporated into a semiconductor device manufacturing exposure apparatus and which has a function of automatically detecting illuminance distribution on the surface of a photomask.
Figure 7:
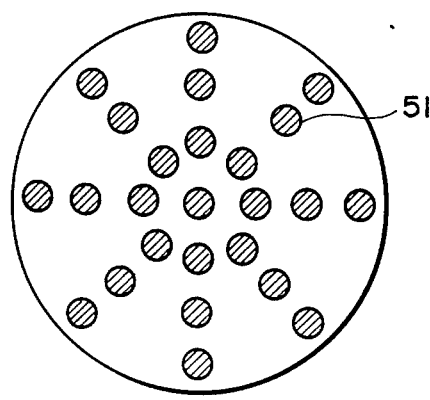
FIG. 7 is a plan view showing an example of layout of photodetectors used in the FIG. 6 embodiment.

Referring now to FIG. 6, there is shown an illuminating optical device according to another embodiment of the present invention, which is incorporated into a semiconductor device manufacturing exposure apparatus. Elements of the FIG. 6 embodiment having similar or corresponding functions as of those of the foregoing embodiment are denoted by the same reference numerals. In the FIG. 6 embodiment, a light source 1 comprising an Hg lamp is disposed at a first focal point of an elliptical mirror 2. The light emitted from the light source 1 is concentrated by the elliptical mirror 2 to an optical integrator 4 which is disposed at the position of a second focal point of the elliptical mirror 2. The optical integrator 4 functions as means for producing plural secondary light sources, as described in the foregoing. The light emerging from the optical integrator 4 enters into an illuminance-distribution changing lens system 5. Denoted in FIG. 6 by numerals 51 – 51 are photoreceptors supported by a common supporting member 50 (see also FIG. 7) which is placed, in the FIG. 6 state, in the plane in which a photomask for the manufacture of semiconductor devices is to be placed. The photoreceptors 51 – 51 are electrically connected to analog-to-digital converters 60 – 60 which are in turn electrically connected to a common computer (central processing unit) 70. Denoted also in FIG. 6 by numeral 80 is a driving motor for moving one or more of the lens components of the illuminance-distribution changing lens system 5. The driving motor 80 is driven in response to instruction signals supplied thereto from the CPU 70.

In the semiconductor device manufacturing exposure operation, an unshown photomask is placed at the position of the supporting member 50, and the light emitted from the optical integrator 4 impinges, after passing through the illuminance-distribution changing lens system 5, on the surface of the photomask. When the adjustment of the illuminance distribution is desired, the unshown photomask is replaced by the supporting member 50 carrying thereon the photo-receptors 51 – 51. By this, the photoreceptors 51 can detect the illuminance at various points in the effective illumination range in the plane in which the photomask is to be placed. Output signals from the photoreceptors 51, produced by the photoelectric conversion, are applied to the analog-to-digital converters 60 – 60, whereby the output signals of the photoreceptors are converted into digital signals. The outputs of the converters 60 – 60 are supplied into the CPU 70, by which the illuminance distribution is computed. And, on the basis of the calculation, the CPU 70 produces an instruction signal to actuate the driving motor 80 so as to displace one or more lens components of the illuminance-distribution changing lens system 5 thereby to adjust the illuminance distribution on the plane in which the photomask is to be placed.

The photoreceptors 51 – 51 and the supporting member 50 therefor may be disposed in the plane in which a semiconductor wafer is to be placed. Also, they may be disposed in the plane which is in close proximity to the masking member 6 shown in FIGS. 1 and 4.

Referring now to FIG. 8, there is shown an illuminating optical device according to a further embodiment of the present invention, which is incorporated into a semiconductor device manufacturing exposure apparatus. The optical arrangement of the illumination system is essentially the same as that of the FIG. 1 embodiment. Also in the present embodiment, elements having similar or corresponding funtions as of those of the foregoing embodiments are denoted by the same reference numerals.

In the FIG. 8 embodiment, similar to the FIG. 1 embodiment, an illuminance-distribution changing lens system 5 is arranged to illuminate the plane of a masking member 6, and any change in the illuminance distribution on the surface of the masking member 6 is reproduced on the surface of a reticle 50. That is, condenser lenses 7a and 7b are provided so as to form an image of the masking member 6 onto the surface of the reticle 50. The image of the reticle 50 is formed by means of a projection lens system 21 onto a surface of a semiconductor wafer 22. What is distinguished from the FIG. 6 embodiment is that, in the present embodiment, only one photoreceptor 52 is disposed in the same plane of the semiconductor wafer 22.

In the FIG. 6 embodiment, plural photoreceptors 51 – 51 are provided so as to detect, at the same time, the illuminance defined at different points on the same plane, and one or more lens components of the illuminance-distribution changing lens system are displaced by the driving motor until unevenness in the illuminance is suppressed to a tolerable level or a desired illuminance distribution is attained. According to this arrangement, increase in the number of measuring points for the measurement of the illuminance distribution results in increase in the number of the photoreceptors. In the FIG. 8 embodiment, as compared therewith, the single photoreceptor 52 is arranged to be moved along the plane in which the semiconductor wafer 22 is to be placed, thereby to measure the illuminance distribution over such plane.

As usual, the luminance of the light source such as the Hg lamp minutely fluctuates, which results in "twinkling". In order to avoid influence of such "twinkling" of the lamp 1 on the measurement of the illuminance, another photoreceptor 23 is provided in accordance with the present embodiment. That is, the photoreceptor 23 is disposed so as to receive a portion of the light from the elliptical mirror 2, and output signals of the photoreceptor 23 are supplied into a computer (central processing unit) 70. On the basis of the output signals from the photoreceptor 23, the CPU 70 processes output signals from the photoreceptor 52 so as to avoid the influence of the "twinkling" of the lamp 1. By this, the illuminance distribution on the plane in which the semiconductor wafer 22 is to be placed is accurately measured.

The monitoring photoreceptor 23 may be placed in any position provided that it can detect the fluctuation of the luminance of the light source. For example, a half mirror of low reflection factor may be disposed between the optical integrator 4 and the illuminance-distribution changing lens system 5, and the monitoring photoreceptor 23 may be disposed so as to receive a portion of the light reflected from the half mirror. It is a possible alternative that, in place of moving the photoreceptor 52 along the plane in which the semiconductor wafer 22 is placed, the photoreceptor 52 is moved along the plane in which the reticle 50 is to be placed. As a further alternative, the photoreceptor 52 may be arranged so as to be moved in a plane which is in close proximity to the masking member 6.

Figure 9:
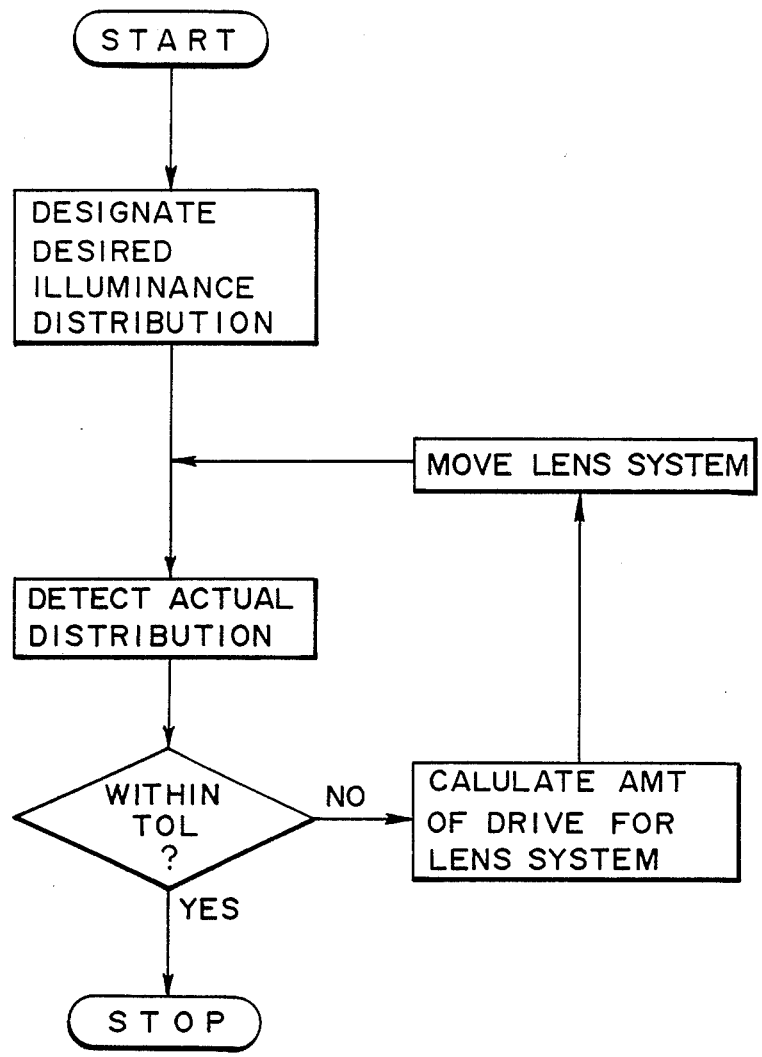
FIG. 9 is a chart showing an algorithm according to which the illuminance distribution is controlled automatically.

FIG. 9 is a chart showing algorithm for the control of illuminance distribution in the illuminating optical device shown in FIG. 6 or 8.

By use of input means of a control system of the semiconductor device manufacturing exposure apparatus, a desired illuminance distribution to be formed on the mask and thus the wafer is inputted from a console into the apparatus, at the time of input of various instructions necessary for effecting the exposure operation. By this, the desired illuminance distribution is designated. Subsequently, an actual illuminance distribution formed in the effective illumination range is measured or detected automatically by use of one or more photoreceptors. And, data obtained by the measurement of the actual illuminance distribution is compared with the data concerning the desired illuminance distribution having been inputted from the console. If the detected actual illuminance distribution is within a tolerance set for the desired illuminance distribution, the exposure process is initiated. If not within the tolerance, on the other hand, the amount and direction of necessary displacement of the lens component of the illuminance-distribution changing lens system are calculated on the basis of the difference between the data concerning the actual illuminance distribution and the data converning the desired illuminance distribution. And, in accordance with the result of calculation, the driving means such as a motor or the like for moving the lens component is actuated thereby to displace the illuminance-distribution changing lens component. Then, the actual illuminance distribution formed by the adjusted illumination optical system is measured, and the above-described adjusting operations are repeated until the data concerning the actual illuminance distribution obtained by way of the photoreceptors substantially agrees to the input data.

In accordance with the embodiments of FIGS. 6 – 9, as in the embodiments described with reference to FIGS. 1 and 2, the illuminance distribution can be changed continuously simply by displacing a particular lens component, while satisfactorily suppressing unpreferable decrease in the illuminance, change of numerical aperture, deformation of the image of the light source, etc.

In accordance with the present invention, as has hitherto been described, unevenness in the illuminance can be minimized by the adjustment which is allowed by the present invention. In a case where a lamp is replaced by another whose electrodes are spaced by a gap different from that of the electrodes of the lamp having been used, or where the numerical aperture is changed for a particular purpose, it is possible that the illuminance distribution is changed slightly. In such case, however, the illuminance distribution can be corrected automatically in accordance with the embodiments of the present invention described with reference to FIGS. 6 – 9. Further, if desired, unevenness in the illuminance can be intentionally produced so that a desired illuminance distribution which is not uniform is obtainable automatically.

While, in the foregoing embodiments, the present invention has been described with reference to an illuminating optical device which is incorporated into a semiconductor device manufacturing exposure apparatus such as an alignment and exposure apparatus, a step-and-repeat type exposure apparatus, etc., it will be understood from the foregoing description that the illuminating optical device of the present invention is applicable to other types of apparatuses in which formation of a particular or desired illuminance distribution is required.

While the invention has been described with reference to the structures disclosed herein, it is not confined to the details set forth and this application is intended to cover such modifications or changes as many come within the purposes of the improvements or the scope of the following claims.

What is claimed is:

1. An illuminating optical device comprising:
a light source for emitting a light beam; and
an illuminating optical system for receiving the light beam from said light source to irradiate a surface of an object with the light beam, said illuminating optical system having an optical axis and an illuminance-distribution changing lens system which is movable in the direction of the optical axis to change an illuminance-distribution forming characteristic of said illumination optical system, wherein said illuminance-distribution changing lens system includes, in the order from the light source side to the object side, a first pair of condenser lens elements having a spacing defined therebetween, and a second pair of condenser lens elements having a spacing defined therebetween, and wherein the spacing between said second pair of condenser lens elements is adjustable so as to provide a desired illuminance-distribution forming characteristic while the spacing between said first pair of condenser lens elements is adjustable so as to compensate for a change in another optical characteristic caused by the adjustment of the spacing between said second pair of condenser lens elements.

2. A device according to claim 1, wherein said illuminating optical system further includes an optical integrator and a masking member and wherein said illuminance-distribution changing lens system is disposed between said optical integrator and said masking member.

3. A device according to claim 1, wherein said first pair of condenser lens elements comprise, in an order from the light source side to the object side, a negative meniscus lens having a convex surface facing the light source side and a first positive meniscus lens having a convex surface facing the light source side, and wherein said second pair of condenser lens elements comprise, in an order from the light source side to the object side, a second positive meniscus lens having a convex surface facing the light source side and a first biconvex lens.

4. A device according to claim 3, wherein said illuminating optical system further includes a second biconvex lens disposed at the object side of said first biconvex lens, and a third positive meniscus lens disposed at the object side of said second biconvex lens, said third meniscus lens having a convex surface facing the light source side.

5. An illumination optical device for illuminating a plane, said device comprising:
a light source for emitting light; and
an illumination optical system including first and second lenses, for irradiating the plane with the light from said light source, said first lens being displaceable to change an illuminance distribution on the plane and said second lens being displaceable to compensate for any change in a focal length of said illumination optical system caused by the displacement of said first lens.

6. A device according to claim 5, wherein said illumination optical system further includes an optical integrator and a masking member and wherein said first and second lens systems are disposed between said optical integrator and said masking member.

7. An illuminating optical device, comprising:
a light source for emitting a light beam;
an illuminating optical system for receiving the light beam from said light source to irradiate a surface of an object with the light beam;
photodetecting means for measuring an illuminance distribution on the surface of the object when it is illuminated by said illuminating optical system, wherein said illuminating optical system has an optical axis and an illuminance-distribution changing lens system which is movable in the direction of the optical axis to change an illuminance-distribution forming characteristic of said illuminating optical system; and
driving means for adjusting the position of said illuminance-distribution changing lens system in response to an output signal from said photodetecting means, thereby to change the illuminance-distribution forming characteristic of said illuminating optical system, wherein said illuminance-distribution changing lens system includes, in the order from the light source side to the object side, a first pair of condenser lens elements having a spacing defined therebetween, and a second pair of condenser lens elements having a spacing defined therebetween, and wherein the spacing between said second pair of condenser lens elements is adjustable so as to provide a desired illuminance-distribution forming characteristic while the spacing between said first pair of condenser lens elements is adjustable so as to compensate for a change in another optical characteristic due to the adjustment of the spacing between said second pair of condenser lens elements.

8. A device according to claim 7, wherein said photodetecting means includes a plurality of photoreceptors removably disposed on a plane in which the object is to be placed.

9. A device according to claim 7, wherein said photodetecting means comprises a photoreceptor adapted to be moved along a plane in which the object is to be placed.

10. A device according to claim 9, further comprising a monitoring photoreceptor disposed so as to receive a portion of the light beam from said light source to detect a change in luminance of said light source, said monitoring photoreceptor producing an output signal which is used to correct an output signal from the movable photoreceptor.

11. An illuminating optical device, comprising:
a light source for emitting a light beam; and
an illuminating optical system for receiving the light beam from said light source to irradiate a surface of an object with the light beam, said illuminating optical system having a first aerial lens formed by a first pair of opposed surfaces, and a second aerial lens spaced away from said first aerial lens and formed by another pair of opposed surfaces, wherein the thickness of said second aerial lens is adjustable so as to change illuminance distribution to be formed on the surface of the object and wherein the thickness of said first aerial lens is adjustable so as to compensate for a change in another optical characteristic due to the change in the thickness of said second aerial lens.

12. A device according to claim 11, wherein said pair of surfaces defining said first aerial lens have substantially the same radius of curvature.

13. A device according to claim 12, wherein said pair of surfaces defining said second aerial lens have substantially the same radius of curvature.

14. A device according to claim 11, wherein the thickness of said first aerial lens and the thickness of said second aerial lens are adjustable in an opposite relation.

15. A device according to claim 11, wherein each of said first and second aerial lenses has a meniscus shape.

16. An illumination optical device for illuminating a plane, said device comprising:
a light source for emitting light; and
an optical system having first and second lenses, for irradiating the plane with the light from said light source, said first lens having a position which is adjustable to change an illuminance distribution on the plane and said second lens having a position which is adjustable so as to maintain a focal length of said optical system substantially constant.

17. A device according to claim 16, wherein said optical system is adjustable to change the illuminance distribution while retaining a substantially constant numerical aperture in said optical system.

18. A device according to claim 16, wherein said optical system includes an optical arrangement for forming a plurality of secondary light sources and wherein said first and second lenses are disposed between said optical arrangement and the plane.

19. An illumination optical device for illuminating a plane, said device comprising:
a light source for emitting light;
an illumination optical system for irradiating the plane with the light from said light source, said illumination optical system having first and second movable lenses and
an actuator for moving said first and second lenses to change an illuminance distribution on the plane while maintaining a focal length of said illumination optical system substantially constant.

20. A device according to claim 19, wherein said illumination optical system includes an optical arrangement for forming a plurality of secondary light sources and wherein said first and second lenses are disposed between said optical arrangement and the plane.

21. An illumination optical device for illuminating a plane, said device comprising:
a light source for emitting light;

an illumination optical system disposed to receive the light from said light source, for irradiating the plane with the light, wherein said illumination optical system includes first and second lenses, said first lens being displaceable to change the illuminance distribution on the plane and said second lens being displaceable to compensate for any change in the focal length of said illumination optical system caused by the displacement of said first lens;

means for measuring the illuminance distribution provided by said illumination optical system on the plane; and driving means operable to adjust the position of each of said first and second lenses in response to an output signal from said measuring means, such that a desired illuminance distribution is provided on the plane.

22. A device according to claim 21, wherein said illumination optical system includes, in the order from said light source to the plane, a first pair of condenser lens elements having a spacing defined therebetween, and a second pair of condenser lens elements having a spacing defined therebetween, and wherein the spacing between said second pair of condenser lens elements is adjustable so as to provide a desired illuminance distribution on the plane while the spacing between said first pair of condenser lens elements is adjustable so as to compensate for any change in the focal length of said illumination optical system caused by the adjustment of the spacing between said second pair of condenser lens elements.

23. A device according to claim 22, wherein said measuring means includes a plurality of photo-receptors removably disposed on the plane.

24. A device according to claim 22, wherein said measuring means comprises a photoreceptor adapted to be moved along the plane.

25. A device according to claim 24, further comprising a monitoring photoreceptor disposed so as to receive a portion of the light from said light source to detect any change in illuminance of said light source, said monitoring photoreceptor producing an output signal which is used to correct an output signal from the said movable photoreceptor.

26. An illumination optical device for illuminating a plane, said device comprising:

a light source for emitting light; and an illumination optical system disposed to receive the light from said light source, for irradiating the plane with the light having an illuminance distribution, wherein said illumination optical system includes a lens optical system effective to variably define the illuminance distribution on the plane and wherein said lens optical system includes, in an order from the light source to the plane, a first pair of condenser lens elements having a spacing defined therebetween, and a second pair of condenser lens elements having a spacing defined therebetween, and wherein the spacing between said second pair of condenser lens elements is adjustable so as to provide a desired illuminance distribution on the plane while the spacing between said first pair of condenser lens elements is adjustable so as to compensate for any change in the focal length of said illumination optical system caused by the adjustment of the spacing between said second pair of condenser lens elements.

27. A device according to claim 26, wherein said first pair of condenser lens elements comprise, in the order from said light source to the plane, a negative meniscus lens having a convex surface facing toward said light source and a first positive meniscus lens having a convex surface facing toward said light source, and wherein said second pair of condenser lens elements comprise, in an order from said light source to the plane, a second positive meniscus lens having a convex surface facing toward said light source and a first biconvex lens.

28. A device according to claim 27, wherein said illumination optical system further includes a second biconvex lens disposed at the plane side of said first biconvex lens, and a third positive meniscus lens disposed at the plane side of said second biconvex lens, said third meniscus lens having a convex surface facing toward said light source.

29. An illumination optical device for illuminating a plane, said device comprising:

a light source for emitting light;

an optical system for illuminating the plane with the light from said light source, said optical system having first and second movable lenses and an actuator for moving said first and second lenses to change an illuminance distribution on the plane while maintaining a range of illumination of the plane by said optical system substantially constant.

30. An optical illumination device for illuminating an object, said device comprising:

a light source for emitting light;

an optical arrangement for irradiating the object with the light from said light source, said optical arrangement including an optical integrator and a lens system having first and second movable lenses, said first and second lens being disposed between said optical integrator and the object and along an optical axis of said optical arrangement; and moving means for moving said first and second lenses along the optical axis to change an illuminance distribution on the object defined by said optical arrangement, while maintaining a focal length of said lens system substantially constant.

31. An optical illumination device for illuminating an object, said device comprising:

a light source for emitting light;

an optical arrangement for irradiating the object with the light from said light source, said optical arrangement including an optical integrator and a lens system having first and second movable lenses, said first and second lenses being disposed between said optical integrator and the object and along an optical axis of said optical arrangement; and moving means for moving said first and second lenses along the optical axis to change an illuminance distribution on the object defined by said optical arrangement, while maintaining a range of illumination of the object by said optical arrangement substantially constant.

* * * * *

UNITED STATES PATENT AND TRADEMARK OFFICE
CERTIFICATE OF CORRECTION

PATENT NO. : 4,947,030

DATED : August 7, 1990

INVENTOR(S) : Kazuhiro Takahashi

Page 1 of 2

It is certified that error appears in the above-identified patent and that said Letters Patent is hereby corrected as shown below:

ON THE COVER PAGE

Attorney, Agent or Firm

"Fitzpatrick, Cells, Harper & Scinto" should read --Fitzpatrick, Cella, Harper & Scinto--.

IN THE DRAWINGS

FIGURE 9

"CALULATE" should read --CALCULATE--.

COLUMN 4

Line 39, "(12, 13; 14, 15)" should read --(12, 13, 14, 15)--.

COLUMN 11

Line 60, "photoreceptors 51" should read --photoreceptors 51-51--; and
Line 63, "photoreceptors 51," should read --photoreceptors 51-51,--.

UNITED STATES PATENT AND TRADEMARK OFFICE
CERTIFICATE OF CORRECTION

PATENT NO. : 4,947,030

DATED : August 7, 1990

INVENTOR(S) : Kazuhiro Takahashi

It is certified that error appears in the above-identified patent and that said Letters Patent is hereby corrected as shown below:

COLUMN 13

Line 41, "converning" should read --concerning--.

COLUMN 14

Line 22, "as many" should read --as may--.

Signed and Sealed this

Nineteenth Day of January, 1993

Attest:

DOUGLAS B. COMER

Attesting Officer

Acting Commissioner of Patents and Trademarks